United States Patent [19]

Otsuki et al.

[11] Patent Number: 5,653,891

[45] Date of Patent: Aug. 5, 1997

[54] METHOD OF PRODUCING A SEMICONDUCTOR DEVICE WITH A HEAT SINK

[75] Inventors: Tetsuya Otsuki; Norikata Hama, both of Nagano-ken, Japan

[73] Assignee: Seiko Epson Corporation, Tokyo, Japan

[21] Appl. No.: 437,886

[22] Filed: May 9, 1995

Related U.S. Application Data

[60] Division of Ser. No. 270,917, Jul. 5, 1994, which is a continuation-in-part of Ser. No. 68,665, May 27, 1993.

[30] Foreign Application Priority Data

| Jun. 3, 1992 | [JP] | Japan | 4-142379 |
| Jun. 3, 1992 | [JP] | Japan | 4-142380 |
| Apr. 28, 1993 | [JP] | Japan | 5-103159 |
| Jul. 8, 1993 | [JP] | Japan | 5-169409 |

[51] Int. Cl.$^6$ .................... H01L 21/027; H01L 23/34
[52] U.S. Cl. .................... 216/11; 216/17; 216/56; 216/100; 216/105; 437/902
[58] Field of Search .................... 216/17, 19, 52, 216/56, 100, 102, 105, 11; 437/902, 209

[56] References Cited

U.S. PATENT DOCUMENTS

| 3,212,569 | 10/1965 | McAdam | 165/80 |
| 3,290,564 | 12/1966 | Wolff, Jr. | 317/234 |
| 3,651,562 | 3/1972 | Hambleton | 437/902 |
| 3,679,500 | 7/1972 | Kubo et al. | 216/56 |
| 3,689,993 | 9/1972 | Tolar | 29/583 |
| 3,941,312 | 3/1976 | Ohno et al. | 239/15 |
| 3,965,277 | 6/1976 | Guritz et al. | 430/319 |
| 4,030,943 | 6/1977 | Lee et al. | 437/902 |
| 4,123,293 | 10/1978 | Okinawa et al. | 437/902 |
| 4,151,543 | 4/1979 | Hayakawa et al. | 257/668 |
| 4,684,975 | 8/1987 | Takiar et al. | 357/70 |
| 4,942,497 | 7/1990 | Mine et al. | 361/702 |
| 5,050,040 | 9/1991 | Gondusky et al. | 361/388 |
| 5,068,715 | 11/1991 | Wade et al. | 357/81 |
| 5,089,443 | 2/1992 | Karey et al. | 437/246 |
| 5,105,259 | 4/1992 | McShane et al. | 257/667 |
| 5,157,478 | 10/1992 | Ueda et al. | 257/796 |
| 5,172,213 | 12/1992 | Zimmerman | 257/796 |
| 5,200,365 | 4/1993 | Culver | 437/209 |
| 5,200,809 | 4/1993 | Kwon | 257/707 |
| 5,202,288 | 4/1993 | Doering et al. | 437/209 |
| 5,208,188 | 5/1993 | Newman | 437/220 |
| 5,227,662 | 7/1993 | Ohno et al. | 257/676 |
| 5,229,643 | 7/1993 | Ohta et al. | 257/706 |
| 5,250,815 | 10/1993 | Battersby et al. | 257/6 |
| 5,252,855 | 10/1993 | Ogawa et al. | 257/676 |
| 5,262,927 | 11/1993 | Chia et al. | 361/784 |
| 5,328,870 | 7/1994 | Marrs | 437/216 |
| 5,367,196 | 11/1994 | Mahulikar et al. | 257/787 |
| 5,381,042 | 1/1995 | Lerner et al. | 257/712 |
| 5,444,025 | 8/1995 | Sono et al. | 437/207 |
| 5,455,462 | 10/1995 | Marrs | 257/796 |

FOREIGN PATENT DOCUMENTS

| 164794 | 12/1985 | European Pat. Off. |  |
| 436126 | 7/1991 | European Pat. Off. |  |
| 54-124678 | 9/1979 | Japan . |  |
| 56-122134 | 9/1981 | Japan . |  |
| 58-012341 | 1/1983 | Japan . |  |
| 58-182855 | 10/1983 | Japan | 437/902 |
| 59-027537 | 2/1984 | Japan | 437/902 |
| 59-163813 | 9/1984 | Japan . |  |
| 59-207645 | 11/1984 | Japan . |  |
| 59-218742 | 12/1984 | Japan | 437/902 |
| 61-166051 | 7/1986 | Japan . |  |
| 62-97358 | 5/1987 | Japan . |  |
| 63-179557 | 7/1988 | Japan . |  |
| 63-240053 | 10/1988 | Japan . |  |
| 6-66351 | 3/1989 | Japan . |  |
| 2-106955 | 4/1990 | Japan . |  |
| 2-151077 | 6/1990 | Japan | 437/902 |
| 2-307251 | 12/1990 | Japan . |  |
| 3222464 | 10/1991 | Japan . |  |
| 411758 | 1/1992 | Japan . |  |
| 4-27145 | 1/1992 | Japan . |  |
| 4010558 | 1/1992 | Japan . |  |
| 4-91458 | 3/1992 | Japan . |  |
| 4-158556 | 6/1992 | Japan . |  |
| 4-174551 | 6/1992 | Japan . |  |
| 4-199664 | 7/1992 | Japan . |  |
| 4-230056 | 8/1992 | Japan . |  |
| 4316357 | 11/1992 | Japan . |  |
| 05211262 | 8/1993 | Japan . |  |
| 6-53390 | 2/1994 | Japan . |  |

| 6-97326 | 4/1994 | Japan . |
| 6-97321 | 4/1994 | Japan . |

*Primary Examiner*—R. Bruce Breneman
*Assistant Examiner*—Anita Alanko
*Attorney, Agent, or Firm*—Oliff & Berridge

[57] ABSTRACT

A method of producing a semiconductor device with a convex heat sink that disposes a semiconductor element within a space formed by leads of a lead frame. Bonding pads of the semiconductor element are connected to the leads through wires. The convex heat sink is made from a high heat-conductive material and formed so as to have an outer periphery of a size sufficiently large to overlap the leads. The semiconductor element is disposed at a center portion of the heat sink. An insulator is disposed on the leads. The insulator bonds and fixes the semiconductor element to the heat sink. Resin seals the semiconductor device except for a part of the leads and a top surface of a projecting portion of the heat sink. The insulator has a shape like a tape so as to cover part of the leads and extend along a bottom surface near a circumferential edge of the convex heat sink. The side surface of the projecting portion of the heat sink is scraped out into a curved surface. The method includes providing a thermally conductive material, forming first and second resist films, and etching to produce heat sinks.

16 Claims, 14 Drawing Sheets

FIG. IA
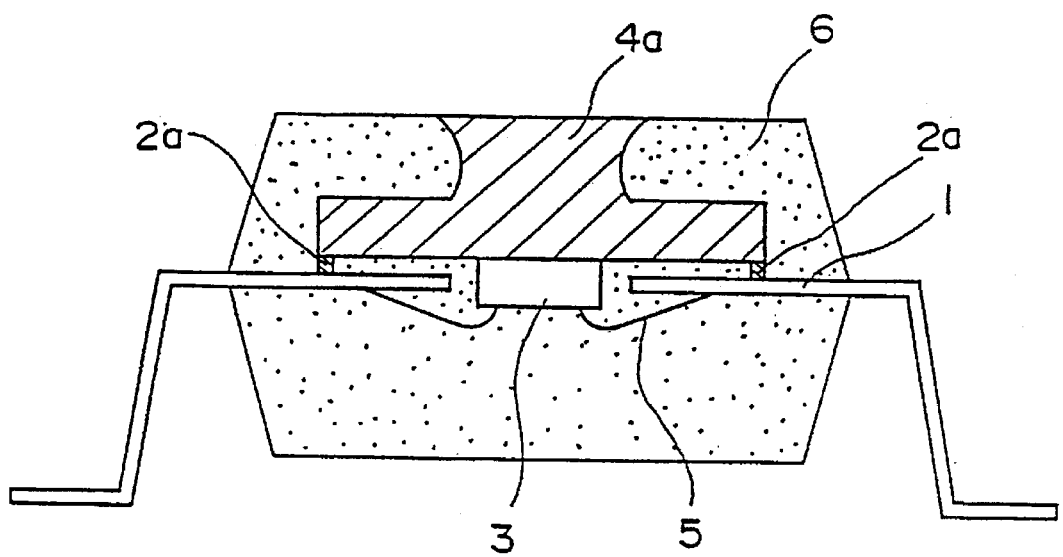
FIG. IB
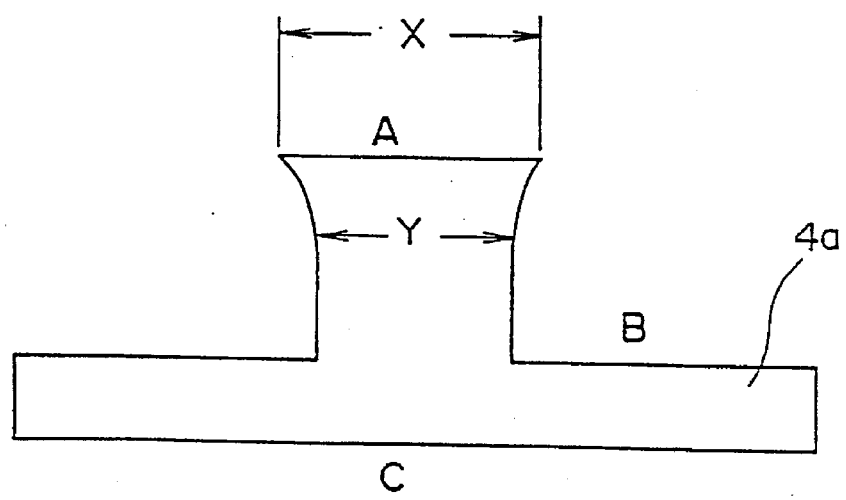

METHOD OF PRODUCING A SEMICONDUCTOR DEVICE WITH A HEAT SINK

CROSS-REFERENCE OF THE RELATED APPLICATION

This is a divisional of copending application Ser. No. 08/270,917 filed on Jul. 5, 1994 which is a continuation-in-part of Ser. No. 08/068,665 filed on May 27, 1993.

This application is a continuation-in-part of U.S. patent application Ser. No. 08/068,665 filed May 27, 1993, pending, contents of which are incorporated herein by reference.

BACKGROUND OF THE INVENTION

1. Field of the Invention

The present invention relates to a semiconductor device with a heat sink and a method of producing the heat sink, and particularly to a semiconductor device with a heat sink and a method of producing the heat sink, in which the heat radiating surface of the heat sink of the convex type

as a heat radiator is exposed to improve the heat radiation property and reliability of the device.

2. Description of the Prior Art

Recently, with the increase of power consumption of a device such as a high integrated CMOS LSI, a demand for a low-cost and low-heat-resistant plastic package has become stronger and stronger. As a countermeasure to this, from the viewpoint of material, a method of making a lead frame or sealing resin have a high heat conductivity has been proposed, and from the viewpoint of structure, a method of changing the design of a lead frame or adding a heat sink, that is, a heat radiator has been inspected or has been put into practice.

Though the description of advantages, disadvantages and features of these methods is given away to special books, the method of adding a heat sink to reduce the heat resistance of a package can be regarded as the most orthodox countermeasure for LSIs of power consumption up to about 2 W per chip in view of the present situation including the near future one.

FIG. 14 is a main portion sectional view schematically illustrating a package structure of a conventional semiconductor device with a heat sink of a partially exposed heat radiator type. In FIG. 14, the reference numeral 1 represents each of leads of a lead frame. A number of leads 1 are arranged so that a quardrangular space portion is formed in the center surrounded by the forward end portions of the respective leads 1. A heat sink 4 constituted by a convex body of high heat-conductive metal such as oxygen-free copper (the structure of which will be described later more in detail) is bonded and fixed, at a circumferential portion of its bottom, onto the leads 1 through an insulating plate 2 such as a polyimide plate. A semiconductor chip (semiconductor element) 3 is attached onto the bottom center portion of the heat sink 4 at a position within the above-mentioned space portion by a bonding agent or the like. Bonding pads (not shown) of the semiconductor chip 3 are connected to the corresponding leads 1 through wires 5 respectively.

In the above-mentioned manner, the semiconductor chip 3 connected to the leads 1 and mounted on the position within the above-mentioned space portion is sealed with sealing plastic such as epoxy resin, except part (for example, outside portions) the respective leads 1 and part (for example, the top surface a projecting portion) of the heat sink 4, so as to form a package 6. The respective portions of the leads 1 projecting out of the package 6 are bent into predetermined shapes so as to form terminals of the device. Thus, the formation of a semiconductor device with a heat sink is completed.

With the above-mentioned configuration, heat generated from the semiconductor chip 3 in use reaches the top surface of the above-mentioned projecting portion of the heat sink 4 effectively through the body of the heat sink 4 which is a low heat-resistant (high heat-conductive) body. Thus, the heat is radiated by air cooling to the outside from the top surface of the projecting portion of the heat sink 4.

FIG. 15 is an enlarged sectional view of the heat sink illustrated in FIG. 14. A conventional convex heat sink 4 is produced by cutting and rolling in combination. Therefore, even if production is made so that a perfect convex body having a convex portion (that is, projecting portion) which has vertical side surfaces should be obtained as the convex body illustrated in FIG. 14, the body produced in practice has rounded or curved corner portions or irregular cut burrs because of working strain or working defect in cutting or rolling respectively as shown in portions A and B in FIG. 15. Although the cutting burrs can be removed in the following process, it is general to use the heat sink with the curved corners left as they are.

In such a conventional semiconductor device with a heat sink and a conventional method of producing such a heat sink, particularly because the heat sink is produced by machining, is difficult to obtain proper flatness and parallelism of a top surface of a projecting portion of the heat sink, so that the edge corner surfaces of the projecting portion of the heat sink are curved. Therefore, the top surface of the projecting portion near these edge corner surfaces is inclined like a gentle descent, and in the case where the curvature of the curved surface of an upper portion of a side portion is too large, the above-mentioned inclined portion is involved in resin at the time of sealing with the resin so that the resin is put thereon. Accordingly, there has been a problem that separation occurs at the boundary between the sealing resin and the heat sink to thereby make the reliability of a semiconductor device of this type deteriorate.

In addition, also from the viewpoint of macrostructure, a conventional heat sink has a problem that the adhesive property of the heat sink with the sealing resin becomes low so that troubles caused by this reduction in adhesion reduce the reliability of a semiconductor device.

Further, there have been problems that it is difficult for a bonding machine to automatically recognize leads of a lead frame, because the surface of the heat sink is bright, particularly at the time of wire bonding. In addition the quality of bonding is not stable because an insulating plate is elastic enough so that it is strained.

SUMMARY OF THE INVENTION

It is therefore an object of the present invention to solve the foregoing problems so as to provide a semiconductor device with a heat sink of a partially exposed heat radiator type in which stable and high reliable wire bonding can be attained at the time of packaging of the semiconductor device and which can be produced with a low cost and has a high heat radiation property, and so as to provide a method of producing such a heat sink.

According to an aspect of the present invention, the semiconductor device with a convex heat sink comprises: a semiconductor element disposed within a space of a lead frame which has the space and a plurality of leads; wires for electrically connecting the plurality of leads to a plurality of pads provided on the semiconductor element respectively; a convex heat sink made from a high heat-conductive material and constituted by a bottom surface on which the semiconductor element and a projecting portion which projects in a direction opposite to the bottom surface, the bottom surface having a size to overlap part of the leads, the projecting portion having a top surface a side of which is made to be larger than a distance between a pair of side surfaces opposite to each other at a predetermined position in the projecting portion; an insulator disposed at overlap part between the leads and the bottom surface so that each of the leads is separated from the convex heat sink by a predetermined distance and each of the leads is joined at its part to the convex heat sink; and resin for sealing the leads, the semiconductor element, the wires, the convex heat sink except the top surface, and the insulator. Thus, the insulator has a tape-like shape which covers part of the leads and extends along the inside surface contacting the outer circumferential edge of the heat sink, and the heat sink has such a shape that the side surface of the projecting portion of the heat sink is scraped out so as to be a curved surface so that the area of the top surface of the projecting portion is larger than the minimum cross-sectional area of the projecting portion.

In this case, preferably, the high heat-conductive material consists of a selected one of an element of copper, an element of aluminum, an element of silver, an element of gold, and an alloy of any of the above metal elements. Particularly from the viewpoint of economics, it is preferable to use copper.

Such a structure that the side of the projecting portion of the heat sink is scraped out so as to be a curved surface so that at least the minimum cross-sectional area in the projecting portion is smaller than the area of the top surface of the projecting portion is produced by wet-type etching. The surface roughness of the projecting portion of the heat sink is not more than 3 µm, and the deviation from parallelism between the top surface and the bottom surface of the projecting portion is not more than 3 µm.

Further, preferably, the heat sink has, on its surface, a dark color surface treatment layer obtained by alkaline oxidation treatment.

Preferably, the heat sink has a quadrangular shape in cross section, and has a plurality of through holes formed symmetrically in plane portion of the convex heat sink other than the top surface of the projecting portion so as to penetrate the convex heat sink in the direction of thickness thereof. The respective shapes of the top and bottom surfaces of the heat sink may be different from each other. Particularly, for example, the shape, for example, quadrangular shape, of the top surface of the projecting portion may lack corner portions.

Further, a silver-plated surface having an area larger than the chip area of the semiconductor element may be provided in the position of the bottom surface of the heat sink where the semiconductor element will be fixedly mounted.

The top surface of the projecting portion of the heat sink may be subject to solder plating treatment after resin packaging.

According to another aspect of the present invention, the method of producing heat sinks for semiconductor devices with convex heat sinks respectively, comprises the steps of: forming first resist films selectively on one surface of a high heat-conductive material in order to form projecting portions of the convex heat sinks respectively; forming second resist films selectively on the other surface of the material different from the one surface in order to form bottom surfaces of the convex heat sinks respectively; and conducting etching on the material from the one and the other surfaces thereof by using the first and second resist films as masks until the material is separated into a plurality of pieces at predetermined intervals. In this case, the small resist films (that is, the first resist films) each having an area identical with the area of the top surface of each projecting portion are arranged at predetermined intervals on the one surface of the material having a thickness equal to the thickness of each of the heat sinks to be formed and the large resist films (that is, the second resist films) each having an area identical with the area of the bottom surface of each of the heat sinks are arranged at predetermined intervals on the other surface of the material at positions corresponding to the small resist films. Then, wet-type etching is conducted from the one and the other surfaces of the material with the small and large resist films as masks to thereby form the individual convex materials with resist films, and then the small and large resist films of the individual convex materials are removed to thereby form the individual convex heat sinks.

According to a further aspect of the present invention, the method of producing heat sinks for semiconductor devices with convex heat sinks respectively, comprises the steps of: forming first resist films selectively on one surface of a high heat-conductive material in order to form projecting portions of the convex heat sinks respectively; forming a second resist film over the whole of the other surface of the material different from the one surface; conducting etching on the material from the one surface by using the first resist films as a mask until the projecting portions are formed predeterminedly; and dividing the material, by machining, at regions subjected to the above-mentioned etching. In this case, the first resist films each having an area identical with the area of the top surface of each projecting portion are arranged at predetermined intervals on the one surface of the material having a thickness equal to the thickness of each of the convex heat sinks to be formed and the second resist film is formed over the whole of the other surface of the material. Then, wet-type etching is conducted from the one surface of the material to a predetermined depth with the first resist films as masks to thereby form the connected convex bodies of the material with the respective resist films, and then the connected convex bodies of the material are equidivided at the etched portions after removal of the resist films to thereby form the individual convex heat sinks.

Preferably, in the above-mentioned two methods of producing heat sinks for semiconductor devices with heat sinks, oxygen free copper is used as the material, and an etching liquid of iron (II) chloride is used in the wet-type etching.

It is preferable that, before the large resist film is formed, silver-plated surfaces are formed in the positions of the heat sinks where the semiconductor elements will be bonded and fixed.

It is convenience that, before the resist film is formed over the whole of the other surface of the material, silver-plated surfaces are formed in the positions of the heat sinks where the semiconductor elements will be bonded and fixed.

According to the present invention, in a semiconductor device in which a semiconductor element is provided in a center space portion of a lead frame, bonding pads of the semiconductor element are connected to inner leads of the lead frame through wires such as gold wires before sealing with resin or the like, and a high heat-conductive convex heat sink of, such as, copper is used in place of an ordinary die pad so that a part of the heat sink is exposed to the outside of the semiconductor device, the heat sink has such a structure that the heat sink is shaped to be convex, and the side of the projecting portion thereof is scraped out so that sealing resin is stored in the scraped portion of the heat sink to thereby improve the adhesive property and stiffness of the seating resin.

In addition, dark color surface treatment such as blackening treatment is conducted onto the surface of the heat sink. Accordingly, at the time of wire bonding, a bonding apparatus can recognize the leads easily to make the wire bonding stable. With the blackening treatment, the adhesive property of the sealing resin to the heat sink is improved to increase the reliability of the semiconductor device.

In addition, through holes are provided in the portion except the exposed surface of the projecting portion. Accordingly, the sealing resin is put into the through holes, so that the upper and lower sealing resins sandwiching the lead frame therebetween communicate each other through these holes to improve the adhesive property of the heat sink resin is improved to thereby make it possible to obtain a package superior in reliability.

In addition, in the case where a silver-plated surface having an area larger than the chip area of the semiconductor element is provided in the position of the bottom surface of the heat sink where the semiconductor element will be fixedly mounted, it is possible to conduct the wire bonding through this silver-plated surface in various modifications.

Further, if the top surface of the projecting portion is subjected to solder plating treatment after packaging, it is useful to prevent corrosion of the semiconductor device.

In addition, the convex shape of the heat sink is formed by etching. Accordingly, no mechanical stress is given to the heat sink, so that the quality of the heat sink and the package using the heat sink is made to be stable.

In addition, by the production through the etching, it is made possible to realize a heat sink in which the surface roughness of the projecting portion is made to be not more than 30 µm, and the deviation from the parallelism between the top surface of the projecting portion and the bottom surface of the heat sink is made to be not more than 30 µm. Accordingly, it is possible to prevent the exposed surface of the heat sink from being involved in the sealing resin.

BRIEF DESCRIPTION OF THE DRAWINGS

FIG. 1A shows a main portion sectional view illustrating an embodiment of the semiconductor device with a heat sink according to the present invention, and a FIG. 1B shows schematic sectional view illustrating an embodiment of the heat sink according to the present invention;

DETAILED DESCRIPTION OF THE PREFERRED EMBODIMENTS

Embodiment 1

Figure 2A:
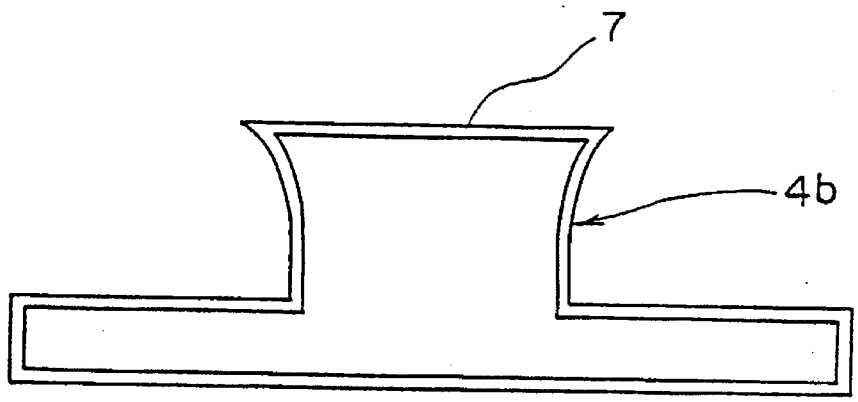
FIG. 2A shows a main portion sectional view of the heat sink according to the present invention, the surface of which is subjected to dark color treatment such as blackening treatment.

FIG. 1A and 1B typically show main portion of an embodiment of a semiconductor device with a heat sink according to the present invention. FIG. 1A includes a sectional view of the device, and FIG. 1B shows a main portion sectional view of the heat sink used in the FIG. 1A.

First, in FIG. 1A, the reference numeral 1 represents leads of a lead frame, and 4a represents an convex heat sink made from a high heat-conductive material such as oxygen-free copper or the like. The heat sink 4a is bonded and fixed at its circumferential portion to the leads 1 through an insulating tape 2a such as polyimide. The reference numeral 3 represents a semiconductor chip attached onto the heat sink 4a by a bonding agent or the like. Bonding pads provided on the semiconductor chip 3 are connected to corresponding leads 1 through wires 5 such as gold wires or the like, respectively.

The semiconductor chip 3 connected to the leads 1 in the above-mentioned manner is sealed with plastics such as epoxy resin, except part of the leads 1 and the top surface of the projecting portion of the heat sink 4a so that a semiconductor device with a package 6 is formed. The portions of the leads 1 projecting out of the package 6 are bent into a predetermined shape so as to form device terminals. Consequently, a semiconductor device with a heat sink of an exposed heat radiation type is completed.

That is, the semiconductor device in the embodiment shown in FIG. 1A, is a semiconductor device with a heat sink which is obtained in a manner so that the heat sink 4a and the leads 1 are bonded and fixed through the insulating tape 2a, and then the assembly is sealed with resin or the like after the bonding pads (not-shown) of the semiconductor chip 3 and the inner leads are connected through the wires 5 such as gold wires. Further, the semiconductor device is a semiconductor device with a heat sink, in which in place of a conventional die pad for bonding and fixing the semiconductor chip 3, the semiconductor chip 3 is fixed by use of a high heat-conductive heat sink made from metal or the like, the heat sink being mounted so that the top surface of the heat sink is exposed to the outside of the semiconductor device.

In this case, preferably, the high heat-conductive material of the heat sink consists of a selected one of an element of copper, an element of aluminum, an element of silver, an element of gold, and an alloy of any of the above metal elements. Particularly from the viewpoint of economics, it is preferable to use copper.

A convex heat sink 4a shown in FIG. 1B is formed by wet-type etching as will be described later. At that time, the side of the projecting portion is scraped out so that the condition X>Y is established between the width X of the top surface of the projecting portion and the width Y of the projecting portion at the side thereof, when the heat sink is viewed in section..

With respective to the respective surfaces A, B and C of the heat sink 4a, that is, the top surface of the projecting portion, the side surface of the projecting portion and the bottom surface, roughness of each of the surfaces A and C is made to be not more than 30 μm. The deviation from parallelism between the surfaces A and C is made to be not more than 30 μm. Although it is not always necessary to make the surface B be a mirror surface, it is sufficient if the surface B is made to have roughness of 50 μm.

Embodiment 2

Figure 2B:
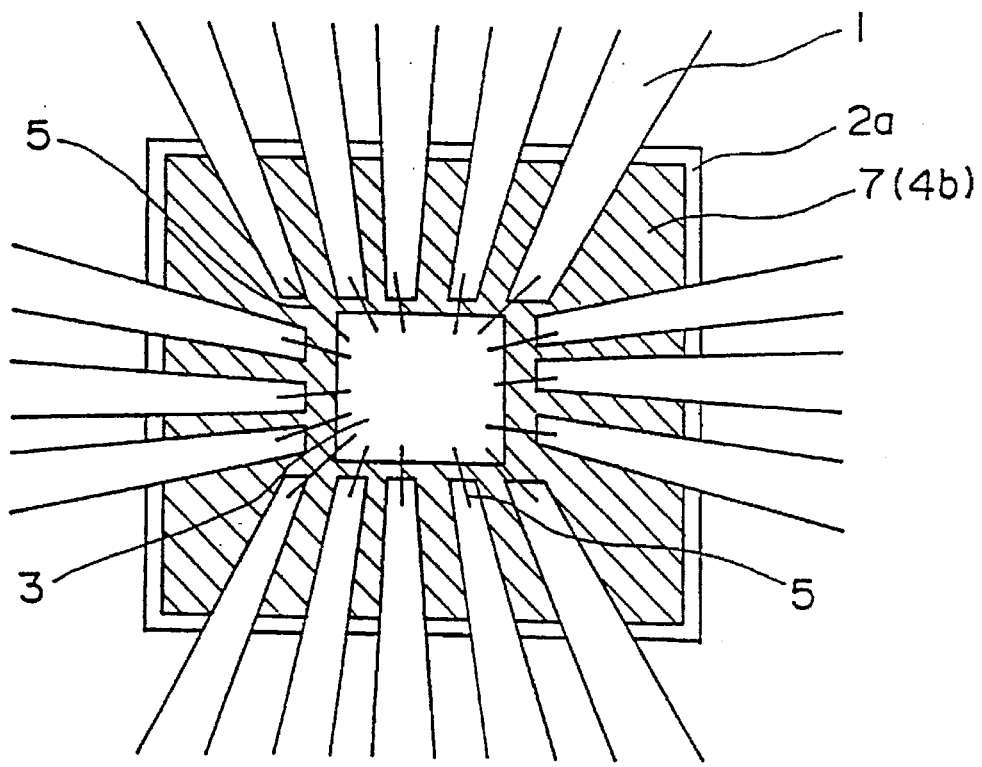
FIG. 2B shows a main portion plan view of a semiconductor device with a heat sink Which is subjected to dark color treatment.

FIG. 2A and 2B typically show another embodiment of the heat sink according to the present invention, which includes a partially sectional view of FIG. 2A of a heat sink 4b which is obtained, for example, by treating the heat sink 4a used in the first embodiment so as to have a dark color treatment, such as blackening treatment layer 7 over the whole surface, and a main portion plan view of FIG. 2B of a semiconductor device with the heat sink 4b, before packaging.

In FIG. 2A and 2B, the reference numeral 1 represents leads of a lead frame, and 4b represents a heat sink having a dark color treatment layer 7. The leads 1 and the heat sink 4b are bonded and fixed through an insulating tape 2a such as polyimide in the same manner as in the embodiment of FIG. 1A and 1B. The reference numeral 3 represents a semiconductor chip attached onto the heat sink 4b by a bonding agent. Bonding pads (not-shown) provided on the semiconductor chip 3 and the corresponding leads 1 are connected through wires 5 respectively.

The dark color treatment layer 7 provided on the surface of the above-mentioned heat sink 4b is obtained in a manner so that the heat sink 4a is immersed, for example, in "Ebonol" (tradename, made by MELTEX Inc.) for several seconds so that the surface of the heat sink 4 is oxidized. By projecting such blackening treatment or dark color treatment on the surface like the heat sink 4b having the dark color treatment layer 7, it is possible to obtain an effect that not only the adhesive property of resin in packaging is improved and the recognition of leads by a bonding machine is made easy in wire bonding, but also the prevention of the surface of copper or the like, which is easily eroded, from being deteriorated.

One of the important features of the above-mentioned Embodiments 1 and 2 is that the insulating tape 2a is used for bonding the heat sink 4a or 4b onto the leads 1. The effect of the insulating tape which was used above will be described with reference to the sectional explanatory diagrams of FIGS. 3 and 4.

Figure 3:
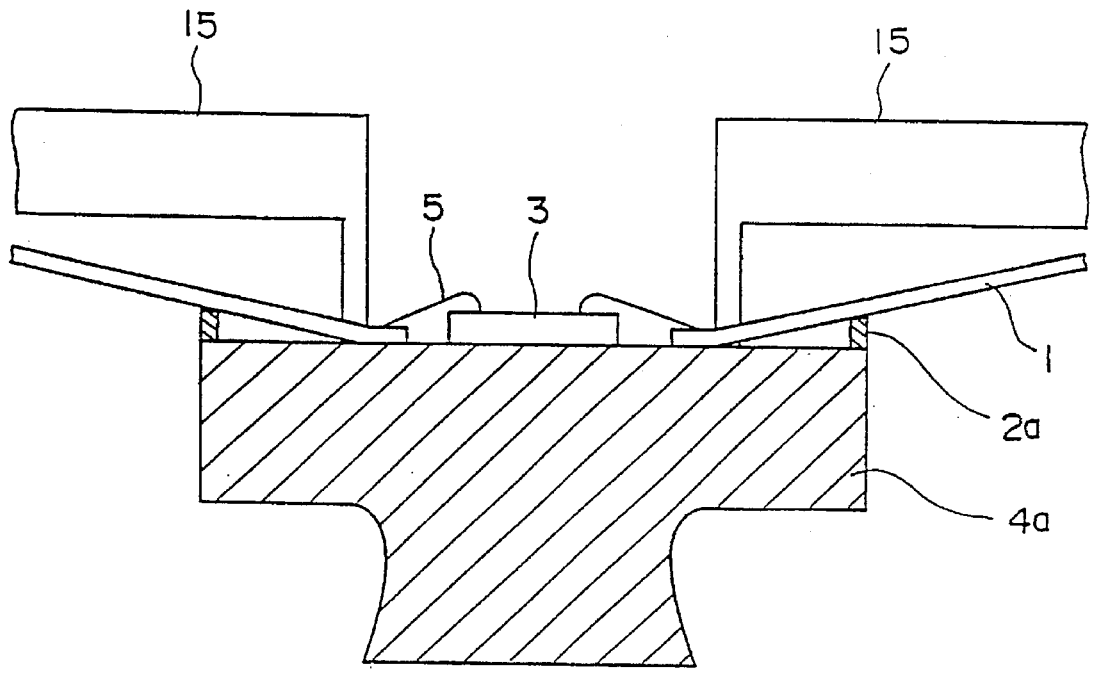
FIG. 3 is a sectional view illustrating an example of wire bonding of the semiconductor device of FIG. 1A and 1B.
Figure 4:
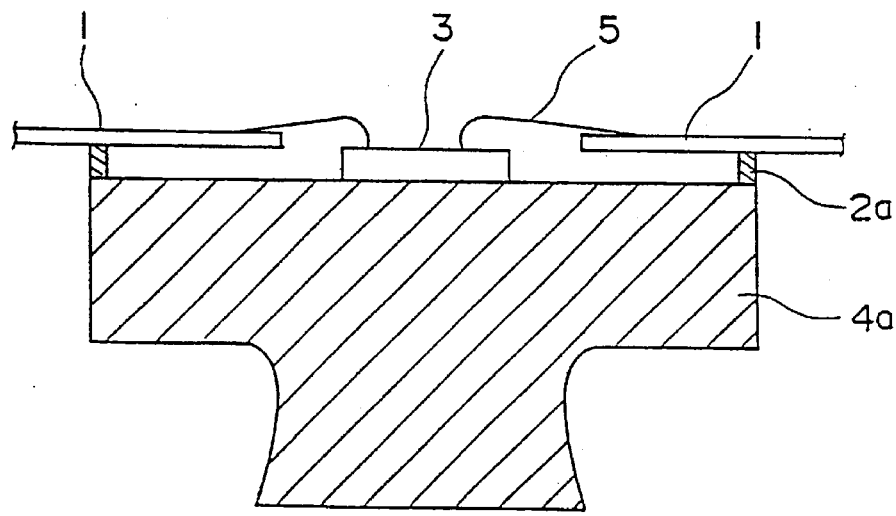
FIG. 4 is a sectional view illustrating the state when the wire bonding of FIG. 3 is finished.

FIG. 3 shows an example of the state of wire bonding. If the forward end portions of the respective leads 1 are pressed down by a lead presser 15, the forward end portions of the leads 1 are brought into contact with the heat sink 4a with the insulating tape 2a as a fulcrum so as to be fixed thereto, because the insulating tape 2a is narrow like a tape. Therefore, in this state, the bonding of the wires 5 can be performed stably. If the lead presser 15 is released to its original position after bonding, the leads 1 is restored to its original state on the basis of its elasticity and kept horizontally as shown in FIG. 4, while the leads 1 are insulated from the heat sink 4a by the insulating tape 2a interposed therebetween like a spacer.

With the insulating tape 2a used for making insulating and fixing between the heat sink 4a and the leads 1 as described above, and with the dark color treatment layer 7 provided on the surface of the heat sink 4a as shown in Embodiment 2, the adhesive property of resin in packaging is improved, and a bonding machine becomes easy to recognize leads in wire bonding.

Here, the state of provision of the insulating tape 2a will be discussed. In the case where a heat sink has a quadrangle bottom like the heat sink 4b shown in FIG. 2A, the insulating tape 2a is provided along all the sides of the bottom (in this case four sides).

Figure 16A:
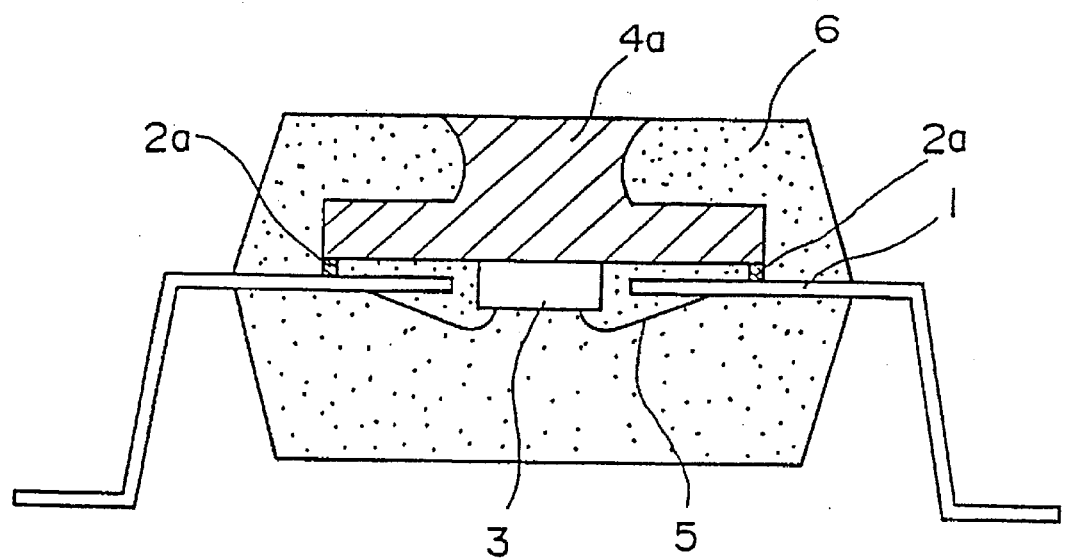
FIG. 16A is a sectional view of the package according to the present invention.
Figure 16B:
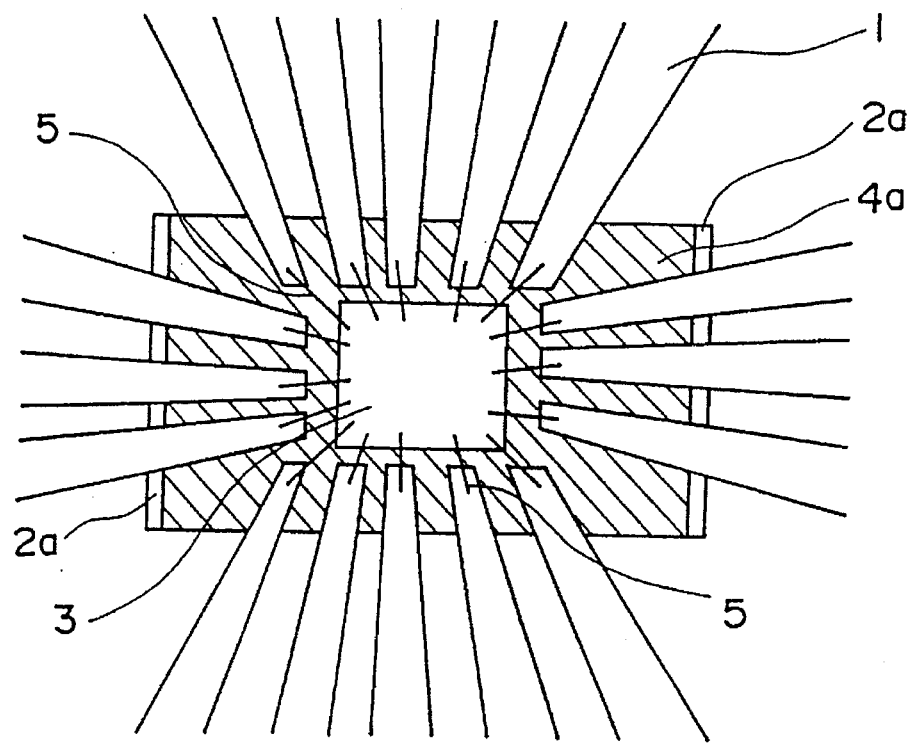
FIG. 16B is an explanatory view showing an embodiment of the state of provision of the insulator of this package.

In the case where a rectangular heat sink which is suitable for use for a rectangular package like a heat sink 4a shown in FIG. 16A and 16B, however, the length of the respective leads 1 generally varies in accordance with the sides of the bottom and it is therefore preferable to provide the insulating layer 2a along only the sides where the leads become longer (here, the shorter sides of the heat sink). That is, in this configuration, it is possible to gain the length of the leads 1 since the insulating tape 2a supports longer leads 1. Further, this configuration is preferable to satisfy the prior condition that it is better to reduce the insulator in quantity in view of reliability and moisture resistant property.

In amplification of the above-mentioned, by use of such a state of provision, there arises advantages in that it is possible to use leads only in the two directions, not in the four directions, according to circumstances so that it is possible to provide an insulator properly in necessary portions.

Although the dark color treatment layer 7 is provided over the whole surface of the heat sink 4a in the above embodiments, as shown in the drawing FIG. 2A, it is not always necessary to provide the dark color treatment layer 7 over the whole surface of the heat sink 4a but, preferably, it is sufficient if the layer 7 is provided on the resin adhesion surface portion and semiconductor element mounting surface portion of the heat sink 4a.

Although both the top and bottom surfaces of the projecting portion of the heat sink 4a or 4b are quadrangular similarly as shown in the drawing FIG. 2B, it is not necessary to make these surfaces have such similar shapes. For example, the four corners of the top surface of the projecting portion may be curved or cut straight.

Embodiment 3

Figure 5:
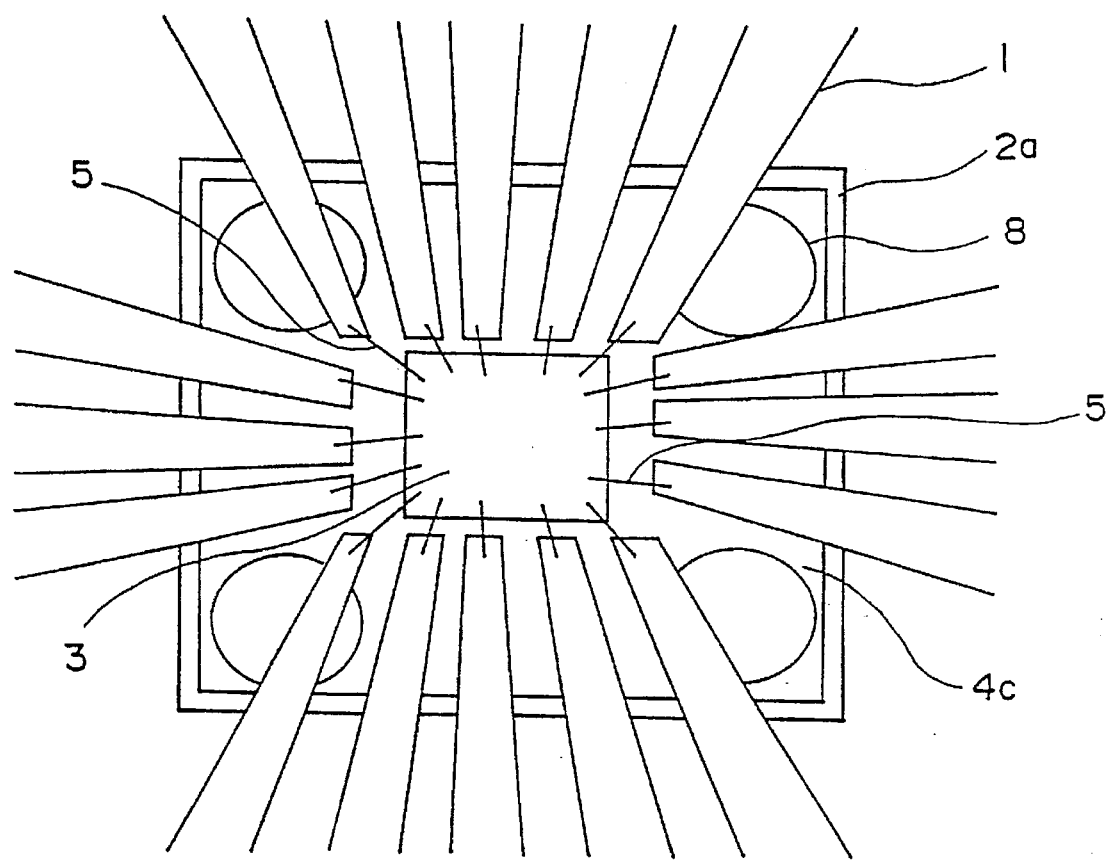
FIG. 5 is a main portion plan view of the semiconductor device with a heat sink according to the present invention, and having through holes.

FIG. 5 is a typical explanatory diagram showing another embodiment of the heat sink according to the present invention. Specifically, FIG. 5 is a main portion plan view of a semiconductor device using a heat sink having through holes. In FIG. 5, the reference numeral 1 represents leads of a lead frame, and 4c represents a heat sink. The leads 1 and the heat sink 4c are bonded and fixed through an insulating tape 2a such as polyimide similarly to the above-mentioned manner. The reference numeral 3 represents a semiconductor chip attached onto the heat sink 4c by a bonding agent. Bonding pads provided on the semiconductor chip 3 and the corresponding leads 1 are connected through wires 5 respectively. The reference numeral 8 represents through holes provided in the four corners of the quardrangular heat sink 4c in portions other than the projecting portion thereof. The through holes 8 are provided at positions between the insulating tape 2a and forward ends of the leads 1, and the number and shape of the through holes 8 are set desirably.

By employing the heat sink 4c with the through holes 8 in the configuration of the present invention, sealing resin is injected also into the through holes 8 in packaging, so that it is possible to improve the adhesive property between the sealing resin and the heat sink. At the same time, molding can be made stiffly in the state that the upper and lower resins while constitute a package and which sandwich the leads 1 therebetween are communicated with each other tightly through the through holes 8. Thus, there is an effect to obtain a stiff package 6.

Embodiment 4

Figure 6A:
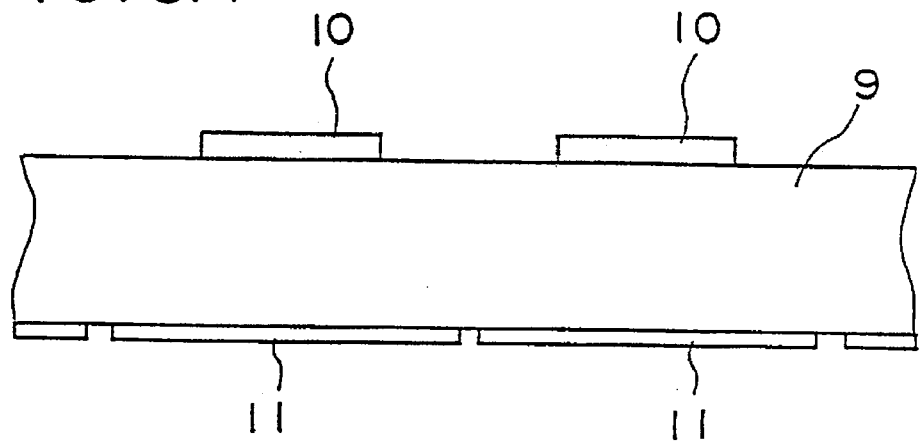
FIG. 6A, 6B and 6C show views showing in section various steps in an embodiment of the method of producing, only by etching, heat sinks according to the present invention.
Figure 6B:
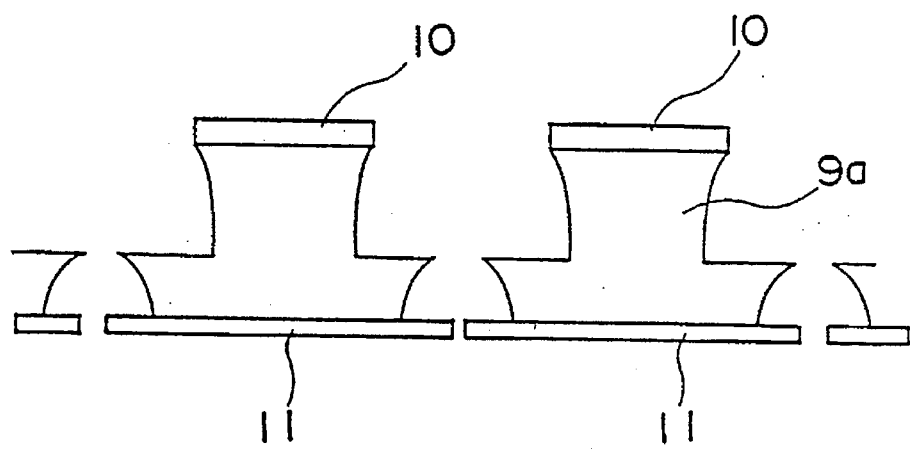
Figure 6C:
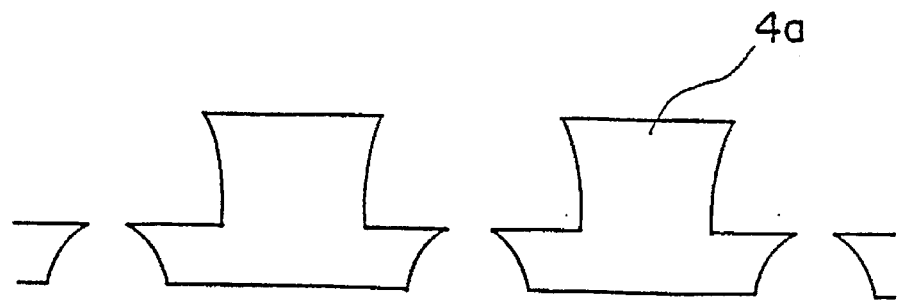

FIG. 6A, 6B and 6C are views including step explanatory diagrams 6A through 6C of an embodiment of the method of producing heat sinks which are used in semiconductor devices with heat sinks according to the present invention. The procedure of the production will be described along the steps shown in the sectional views of FIG. 6A–6C.

First, in FIG. 6A, on one surface (upper surface in the drawing) of a material (metal plate) 9 such as an oxygen-free copper plate having a thickness identical with the plate thickness of heat sinks to be formed, small resist films 10 are provided with predetermined intervals in order to form projecting portions of the respective heat sinks. Then, on the other surface (lower surface in the drawing) of the material 9, large resist films 11 each having an area identical with the area of the bottom surface of each of the convex heat sinks are provided with predetermined intervals in the positions corresponding to the small resist films 10.

Next, as shown in FIG. 6B, wet-type etching is performed from both the one and the other surfaces of the material 9 by use of the large and small resist films 11 and 10 as masks with an etching liquid containing, for example, iron (II) chloride as a main component. The etching is continued till the material 9 is separated into individual portions divided at positions under the predetermined intervals of the large resist films 11 so that individual convex materials 9a with the resist films are formed.

Further, as shown in FIG. 6C, the large and small resist films 11 and 10 adhering to the respective convex materials 9a are eliminated in an ordinary manner so that individual convex heat sinks 4a are obtained.

As is apparent from the above description, this embodiment shows a method of producing heat sinks only by etching. Since the process of this embodiment is carried out, the upper and lower side surfaces are etched so as to be undercut to produce a shape scraped curvedly. Therefore, such projecting portions satisfying the condition of X>Y as described above with respect to the diagram of FIG. 1B can be obtained. The upper and lower surfaces of the material are masked so as not to be etched so that surface roughness not more than 30 μm is attained on the respective surfaces A and C among the surfaces A, B and C (refer to the diagram of FIG. 1B of the heat sink 4a, that is, the top surface of the projecting portion, the side surface of the projecting portion, and the bottom surface of the heat sink. The deviation from parallelism between the surfaces A and C is also kept to be not more than 30 μm. In addition, it is ensured that the surface B is formed with roughness of about 50 μm.

Embodiment 5

FIG. 7A, 7B, 7C and 7D are views including step explanatory diagrams FIG. 7A to FIG. 7D showing another embodiment of the method of producing heat sinks according to the present invention. The procedure of the production will be described along the step sectional views FIG. 7A–7D.

Figure 7A:
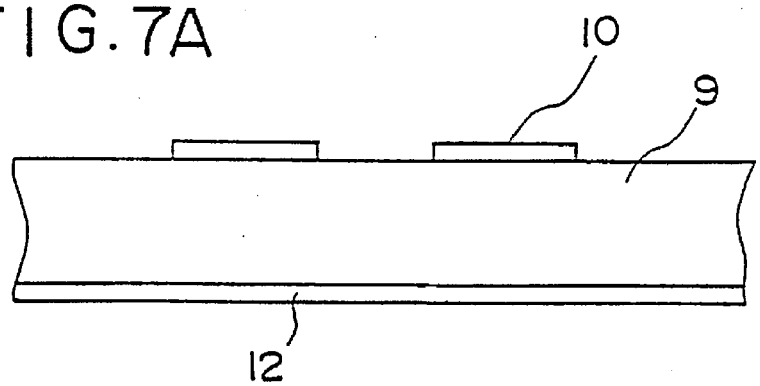
FIG. 7A, 7B, 7C and 7D show views showing in section various steps (a) through (d) in another embodiment of the method of producing, by etching and pressing, heat sinks according to the present invention.

First, as shown in FIG. 7A, on one surface of a material 9 such as an oxygen-free copper plate having a thickness identical with the plate thickness of each of heat sinks to be formed, small resist films 10 are provided with predetermined intervals in order to form the projecting portions of the heat sinks. Then, a resist film 12 is formed over the whole surface of the other surface of the material 9.

Figure 7B:
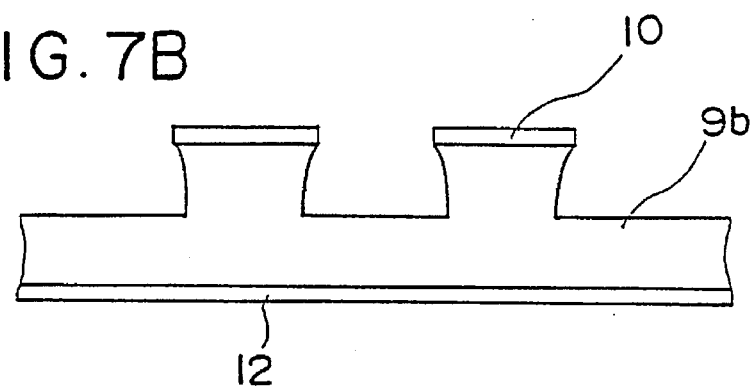

Next, as shown in FIG. 7B, wet-type etching is performed in the same manner as mentioned above on the one surface of the material 9 by use of the small resist films 10 as masks. The etching is continued, for example, up to half the thickness of the material 9 so as to form convex materials 9b with the resist films, the convex materials 9b being connected to each other while having individual projecting portions respectively.

Figure 7C:
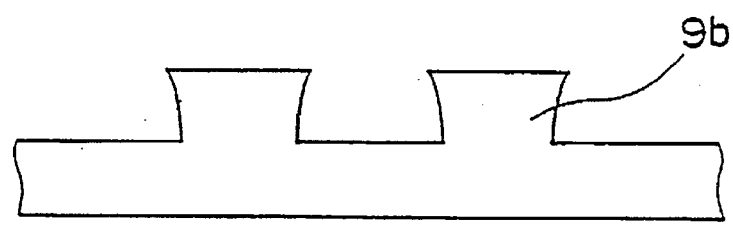
Figure 7D:
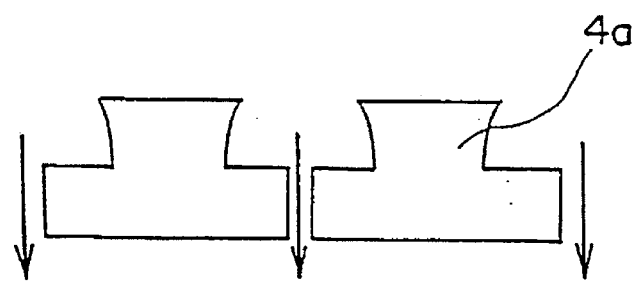

Further, as shown in FIG. 7C, the small resist films 10 and the resist film 12 are removed from the convex materials 9b. Then, as shown in FIG. 7D, the continuous body of the convex materials 9b is divided uniformly at the etched portions by pressing or machining such as cutting or the like so that individual convex heat sinks 4a are obtained. At this time, the pressing may be performed from either the one surface where the projecting portions are formed or the other surface of the material.

As described above, in the heat sink producing method in this embodiment, both the wet-type etching and machining are used in combination. In this case, however, etching is performed from only one surface side, so that there is a feature that it is possible to desirably establish the depth of etching, that is, the height of the projecting portions.

This point can be regarded as a contrastive advantage in comparison with the case of Embodiment 4 where since etching is performed from the opposite surfaces, checking before the step of etching is required so as to adjust the respective intervals of upper and lower masks in order to establish the height of each projecting portion to be a predetermined value.

The other features and effects with respect to the shape, accuracy, and so on, of the heat sinks to be formed are the same as those which were described in Embodiment 4.

11

Embodiment 6

As modifications of the method of producing heat sinks which were described in the above Embodiments 4 and 5, further embodiments of a heat sink having a silver (Ag) plated surface in the position to which a semiconductor chip is to be attached. The embodiment and the structure and effects thereof will be described below.

Figure 8:
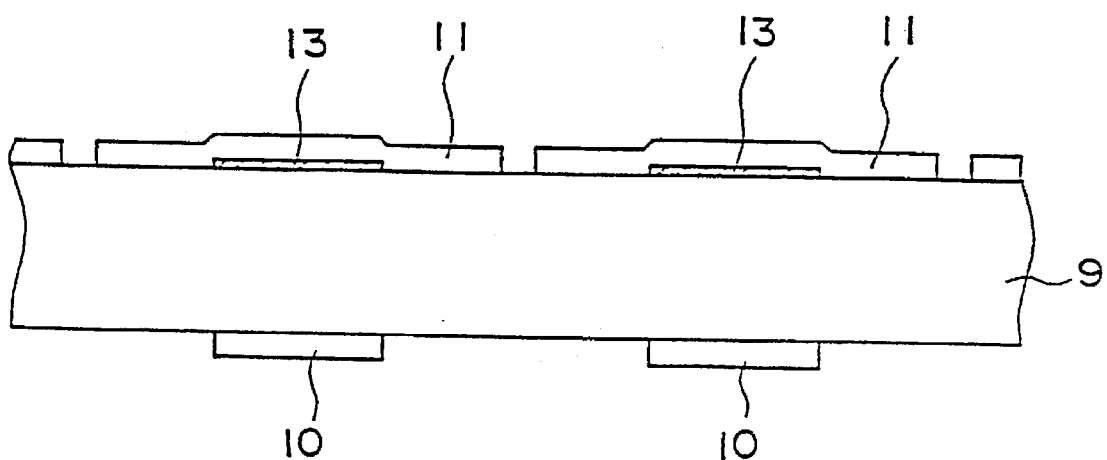
FIG. 8 is a sectional view illustrating the state of a first step in producing heat sinks having silver-plated surfaces according to the present invention.

FIG. 8 is a sectional view illustrating the state of a first stage (stage corresponding to the step of the drawing FIG. 6A in producing heat sinks having silver-plated surfaces respectively. As shown in the drawing, before large resist films 11 are formed on a material 9 in predetermined positions thereof, first, silver-plated surfaces 13 each having a predetermined area are formed on the material 9 at positions where semiconductor chips 3 are attached on the respective heat sinks which will be formed later. Preferably, it is general to set this predetermined area to be layer than, for example, to be 4 to 9 times as large as, the area occupied by each semiconductor chip 3.

After the silver-plated surfaces 13 are formed, the large resist films 11 are formed on one surface, that is, on this silver-plated surface side, of the material 9, and, on the other hand, small resist films 10 are formed on the other surface opposite to the silver-plated surface side. Then, after wet-type etching is performed in the same manner as in the formation method of Embodiment 4, the resist films are removed so that heat sinks 4a having the silver-plated surfaces 13 respectively, according to the present invention are obtained. Then, the heat sinks 4a having the silver-plated surfaces 13 respectively are subjected to dark color treatment by application of the method described in the embodiment of FIG. 2 so as to obtain heat sinks 4b each having a dark color treatment layer 7 on the surface other than the silver-plated surface 13. Since the silver-plated surface cannot be subjected to dark color treatment, it is easy to form such a heat sink 4b having a silver-plated surface 13.

Figure 9A:
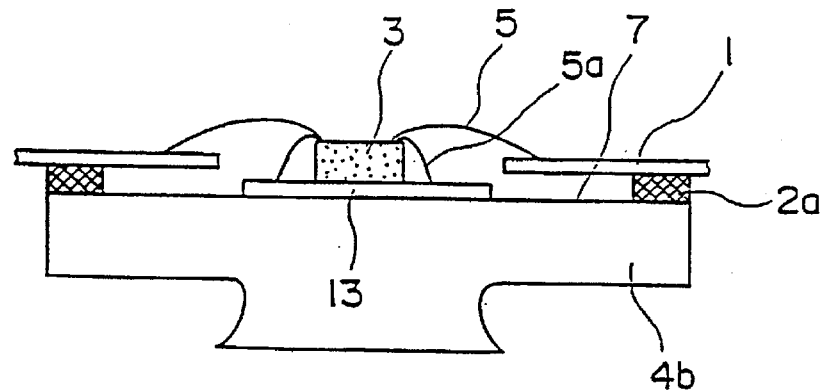
FIG. 9 shows a sectional view illustrating the state of the device before packaging which uses a heat sink having a silver-plated surface according to the present invention.
FIG. 9B shows an explanatory plan view (b) of the same.
Figure 9B:
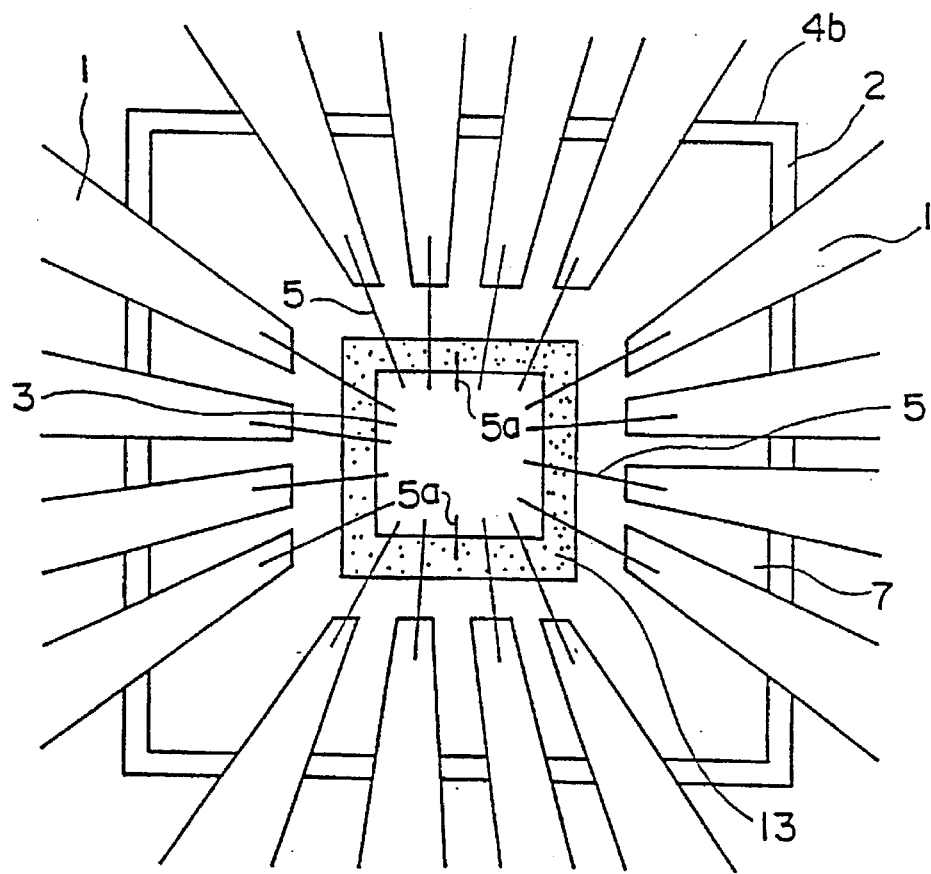

FIG. 9A is a sectional view illustrating the state, before packaging, of an embodiment of a device formed by using such a heat sink having a silver-plated surface, and FIG. 9B is a plan view of the same. In the diagrams FIG. 9A and 9B, the reference numeral 13 represents a silver-plated surface formed at and around the position of a heat sink 4b to which a semiconductor chip 3 is to be attached. The other configuration except wires 5a is the same as that of the semiconductor device shown in the embodiment of FIG. 1A or the like.

The device of this embodiment has a feature in that wires 5a led out from some bonding pads provided for grounding in the semiconductor chip 3 are connected to the silver-plated surface 13 directly so that the silver-plated surface 13 can be commonly used for grounding and the leads can be used for other purposes correspondingly.

In this embodiment, description was made as to an example of wire connection in the case of a heat sink 4b having a silver-plated surface 13 and being subjected to formation of a dark color treatment layer 7. It is a matter of course that the same effects can be obtained, for example, even in the case of use of a heat sink 4a provided with a silver-plated surface 13 while provided with no dark color treatment layer 7.

Embodiment 7

Figure 10A:
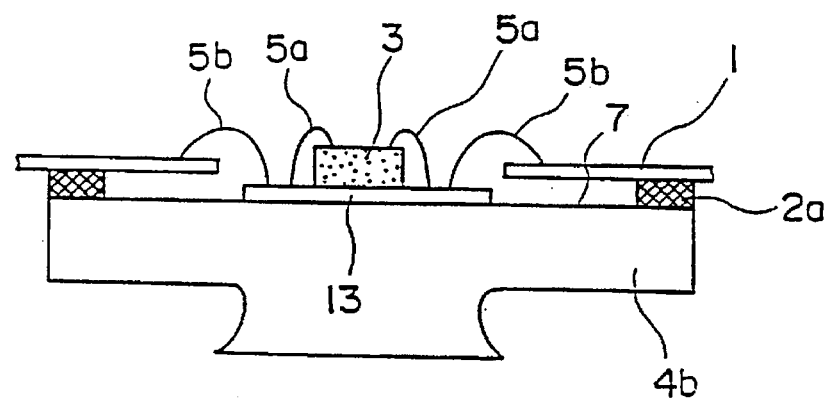
FIG. 10A shows a sectional view illustrating the state of another embodiment of the device before packaging which is formed by use of a heat sink having a silver-plated surface according to the present invention.
Figure 10B:
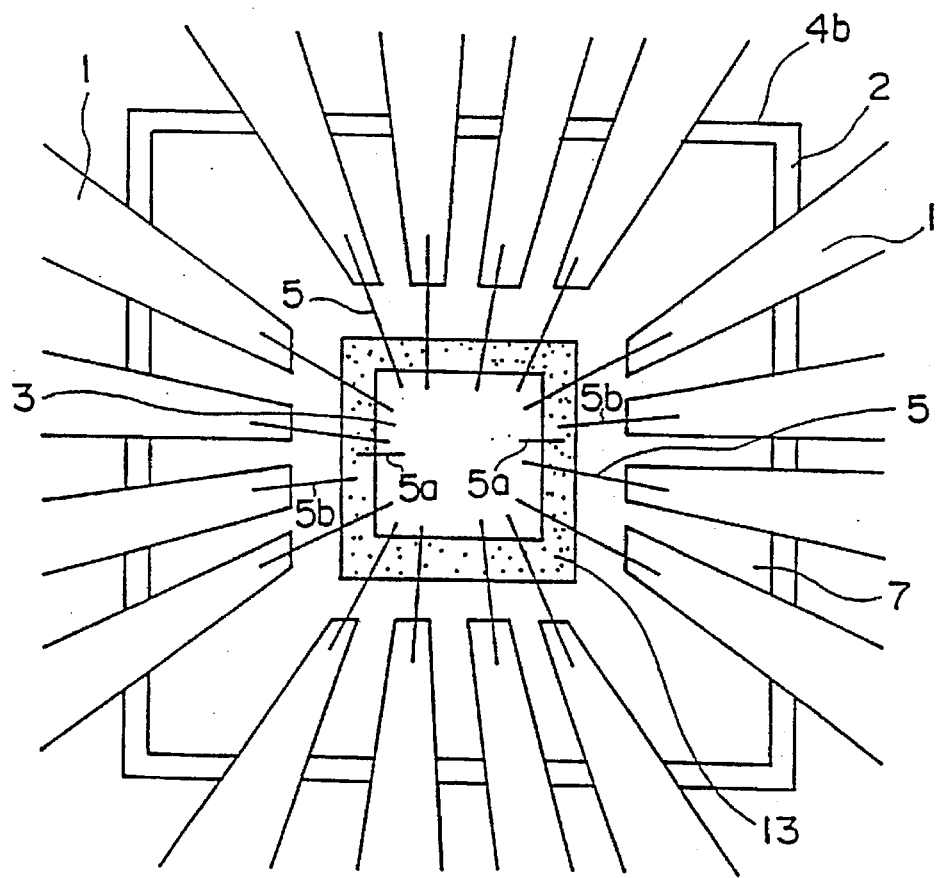
FIG. 10B shows a plan view of the same.

FIG. 10A is a sectional view illustrating the state, before packaging, of another embodiment of a semiconductor device formed by using such a heat sink having a silver-plated surface, and FIG. 10B is a plan view of the same. In FIGS. 10A and 10B, the reference numeral 13 represents a silver-plated surface formed on the surface of a heat sink 4b at and around a position on which a semiconductor chip 3 is to be attached. Except wires 5b, the configuration is the same as the device of the embodiment of FIG. 9 and so on.

In this embodiment, wires 5b are for direct connection from the silver-plated surface 13 (heat sink 4b) to a small number of leads 1, while wires 5a are for direct connection from a plurality of grounding pads of the semiconductor chip 3 to the silver-plated surface 13 in the same manner as in the case of FIG. 9.

Owing to this wire connection configuration using such a silver-plated surface 13, not only the wires 5a led out from some bonding pads provided for grounding on the semiconductor chip 3 can be connected directly to the silver-plated surface 13 so that the leads 1 may be used for other purposes correspondingly, but also for example bonding is made from a plurality of grounding pads on the semiconductor chip 3 to the surface of the heat sink 4b and from the heat sink to a small number of leads 1 so that it is possible to obtain advantages in that the grounding potential is stable and numbers of grounding points are obtained by means of a small number of leads. In FIG. 10A, the illustration of ordinary bonding wires 5 is omitted.

Figure 11A:
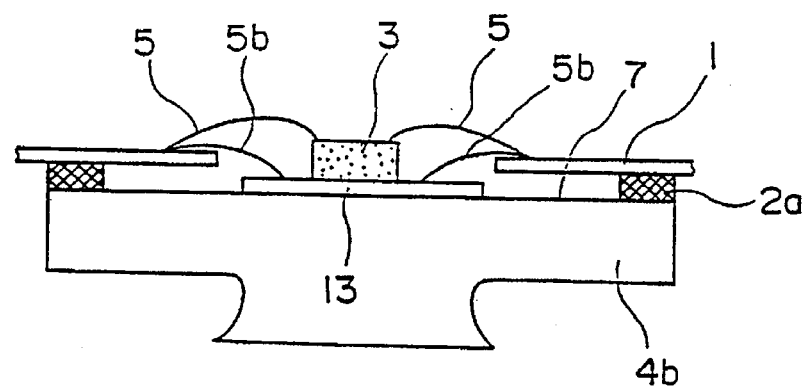
FIG. 11A shows a sectional view illustrating the state of a further embodiment of the device before packaging which is formed by use of a heat sink having a silver-plated surface according to the present invention.
Figure 11B:
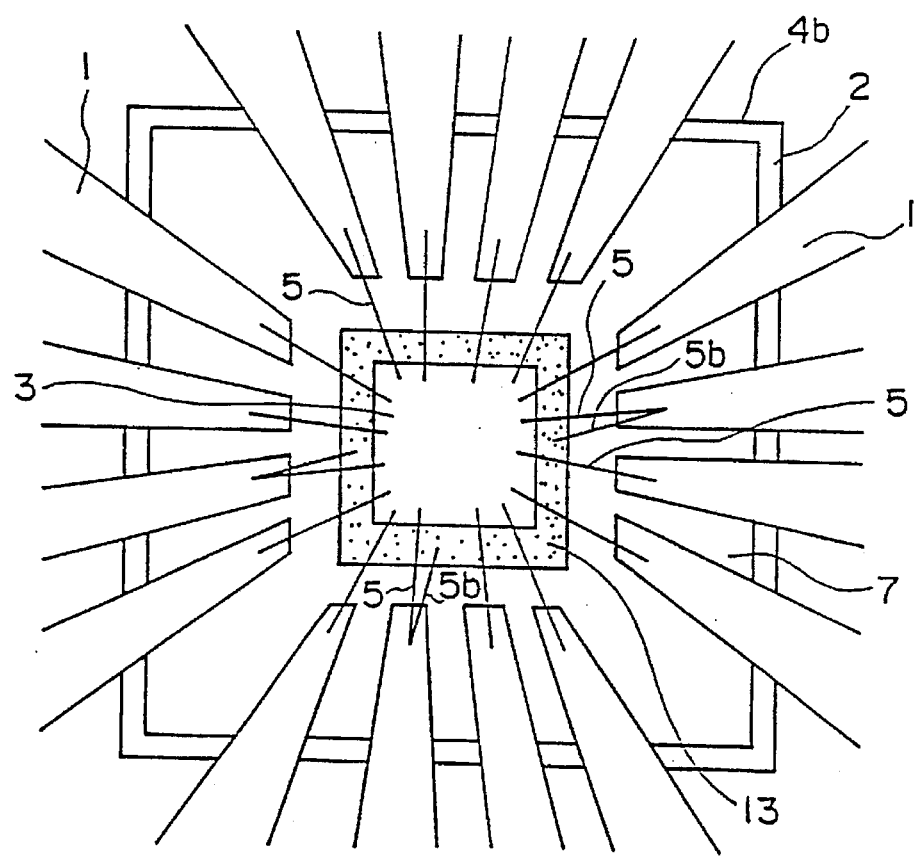
FIG. 11B shows a plan view of the same.

FIG. 11A is a sectional view showing the state, before packaging, of another embodiment of the device formed by using a heat sink having a silver-plated surface, and FIG. 11B is a plan view of the same. In FIGS. 11A and 11B, the reference numeral 13 represents a Silver-plated surface formed on the surface of a heat sink 4b at and around a position on which a semiconductor chip 3 is to be attached. Except the state of wire bonding, the configuration is the same as the device of the embodiment of FIG. 10, and so on.

In the configuration of FIGS. 11A and 11B, bonding is made from the grounding leads 1 to the silver-plated surface 13 of the heat sink 4b through wires 5b and to a plurality of grounding pads of the semiconductor chip 3 through wires 5. The sequence of the connection is such that, in comparison between the grounding pads and the silver-plated surface, connection is made first from the leads to the silver-plated surface 13 which is near the leads, and connection is then made from the leads to the grounding pads which are far from the leads.

In this configuration, there is an advantage that the potential of the rear surface of the semiconductor chip 3 can be agreed with the potential of the ground, and the quality of bonding is superior in comparison with the device of the embodiment of FIG. 10 because, for example, the bending deformation of the wires 5 at their upper portions is gentle.

Figure 12A:
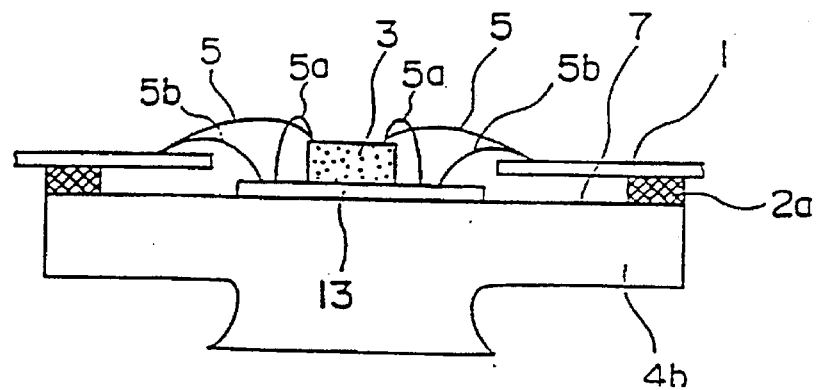
FIG. 12A shows a sectional view illustrating the state of a still further embodiment of the device before packaging which is formed by use of a heat sink having a silver-plated surface according to the present invention.
Figure 12B:
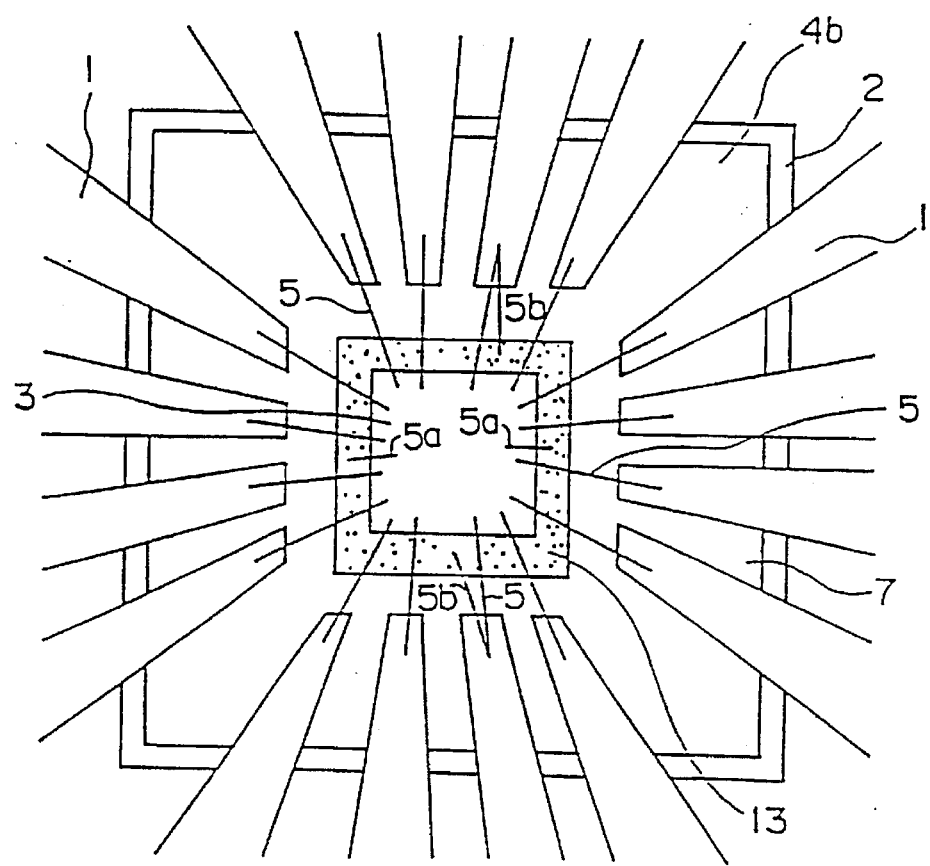
FIG. 12B shows a plan view of the same.

Further, FIG. 12A is a sectional view showing the state, before packaging, of a further embodiment of the device formed by using a heat sink having a silver-plated surface, and FIG. 12B is a plan view of the same. In FIGS. 12A and 12B, the reference numeral 13 represents a silver-plated surface formed on the surface of a heat sink 4b at and around a position on which a semiconductor chip 3 is to be attached. Except the state of wire bonding, the configuration is the same as the device of the embodiments of FIGS. 10 and 11, and so on.

In this configuration, the methods of connection of the wires 5a and 5b through the silver-plated surface 13 shown in FIGS. 11 and 12 are used in combination. That is, wires 5a for connection between the grounding pads of the semiconductor chip 3 and the heat sink and wires 5b for connection between a small number of leads and the heat sink are combined suitably so as to generate an advantage that a preferable embodiment of grounding connection can be obtained.

Embodiment 8

Figure 13:
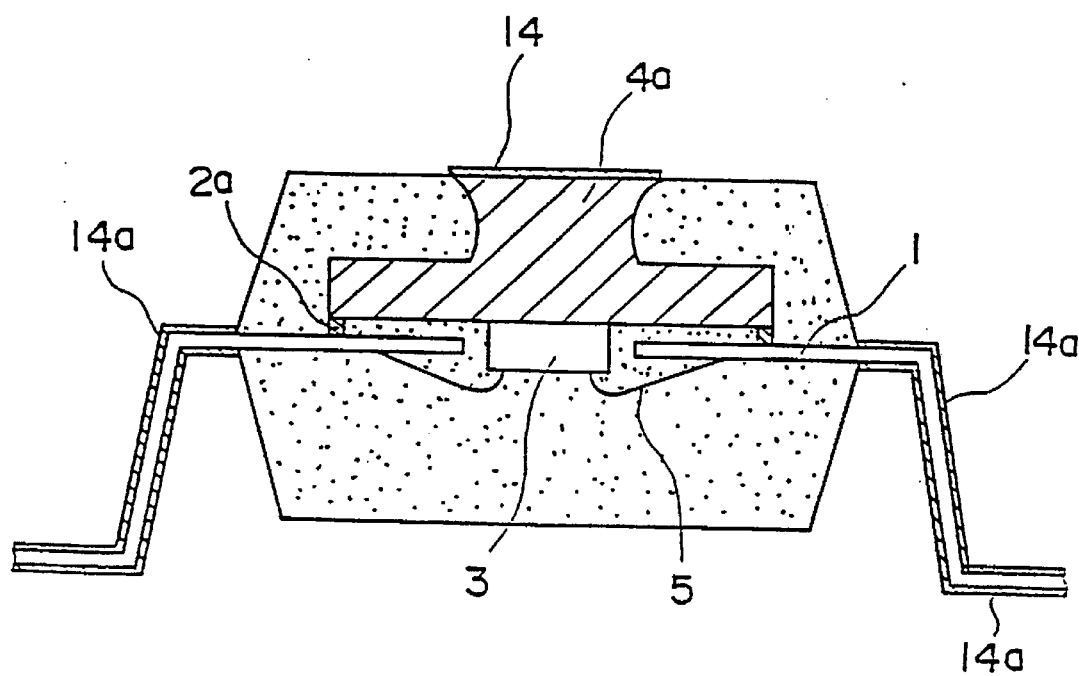
FIG. 13 is a sectional view illustrating another embodiment of the semiconductor device with a heat sink according to the present invention.
Figure 14:
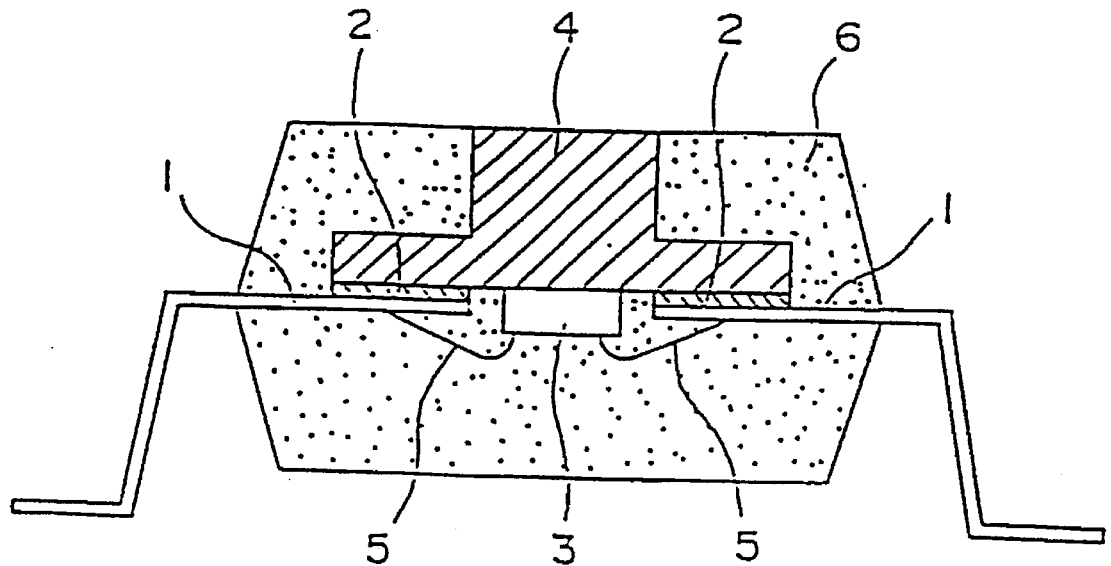
FIG. 14 is a main portion sectional view illustrating a conventional semiconductor device of a exposed radiator type.
Figure 15:
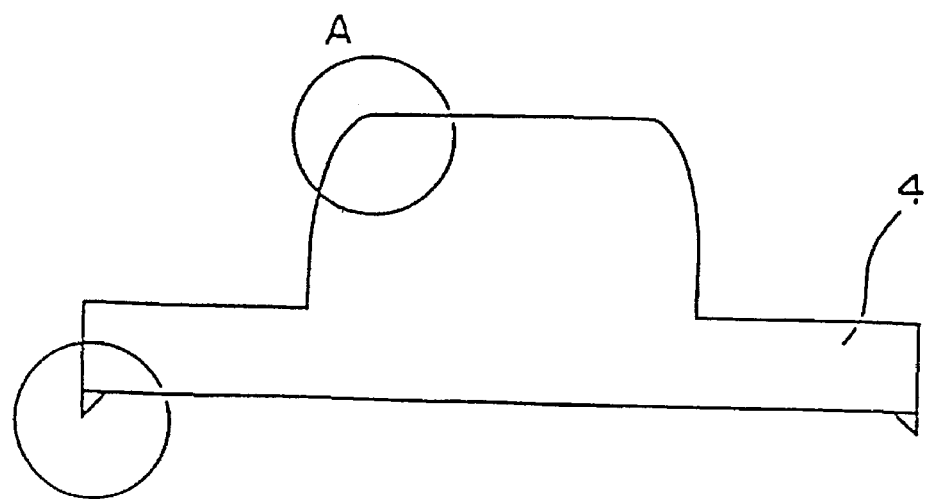
FIG. 15 is a schematic sectional view illustrating a conventional convex heat sink.

FIG. 13 is a sectional view illustrating another embodiment of a semiconductor device with a heat sink according to the present invention. Main configuration of the device of this embodiment is almost the same as that of the device of the embodiment of FIG. 1A. The device of FIG. 13 has a feature in that a solder-plated layer 14 is provided on the top surface of a projecting portion which constitutes an exposed portion of a heat sink 4a.

That is, omitted in the above description, such solder plating 14a as illustrated is conventionally given to leads 1 at portions which are made external terminals in this kind of semiconductor device, for the sake of convenience in practical mounting. The above-mentioned solder-plated layer 14 is formed simultaneously with formation of the solder plating 14a in the same step.

By adding this solder-plated layer 14, it is possible to obtain an effect to improve the prevention of a heat sink from being eroded, for example, in comparison with the case where this surface is coated with such a dark color treatment layer 7 as described in the embodiment of FIG. 2. Further, it is also possible to obtain such an effect in practical use that it is convenient on working such as soldering or the like in the case of applying potential (including a grounding potential) to a heat sink which is insulated electrically.

As has been described above, according to the present invention, in a semiconductor device with a heat sink in which one end surface of a heat sink made from such as metal having a high heat-conductivity is exposed, the heat sink is shaped into a convex shape having a projecting portion which is scraped out so that the condition X>Y is established between the top surface width X of the projecting portion and the minimum width Y at the side surface portion of the projecting portion. Accordingly, the adhesive property of sealing resin to the heat sink is improved, so that the reliability of this kind of semiconductor device is improved.

Among the respective surfaces of the convex heat sink, that is, among the top surface (surface A) of the projecting portion, the side surface (surface B) of the projecting portion, and the bottom surface (surface C), the roughness of the surfaces A and 0 is made to be not more than 30 μm. Further, the deviation from the parallelism between the surfaces A and C is made to be not more than 30 μm. Although it is not always necessary to make the surface B be a mirror surface, if the surface B is made to have roughness of about 50 μm, the surface of the projecting portion is prevented from being involved in sealing resin and coated therewith. Accordingly, it is possible to ensure an exposed surface of a heat sink which is stable and beautiful with no resin separated therefrom. It is also possible to keep stable quality of wire bonding and to ensure the adhesive property of sealing resin.

Further, since a narrow insulating tape is used for bonding a heat sink to leads of a lead frame, the forward end portions of the respective leads abut against the heat sink with the insulating tape as a fulcrum so that the leads are fixed stiffly. Accordingly, it is possible to perform stable bonding of wires in this state.

Further, in accordance with the state of provision of the insulator, not only the length of the leads can be gained but also the quantity of the insulator can be reduced, for example, by providing the insulator along not all the sides of the bottom of the heat sink but along only a pair of opposite sides of the bottom, so that there arises an effect that the semiconductor device can be improved in its reliability and moisture resistant property.

Since the surface of a heat sink is subjected to dark color treatment such as blackening treatment, the recognition of leads in wire bonding is made stable, so that not only the quality of the bonding is improved, but also the adhesive property of sealing resin to the heat sink is improved.

With a heat sink having through holes, sealing resin is injected into the through holes so that upper and lower resins which constitute a package and which sandwich a lead frame therebetween communicate with each other tightly through the through holes and molded stiffly. Accordingly, there is an effect in formation of a stiff package. It is also possible to improve the adhesive property of the sealing resin to the heat sink.

According to the method of producing heat sinks according to the present invention, projecting portions of the heat sinks are formed by etching, so that no mechanical stress is given to the heat sinks and it is therefore possible to produce heat sinks which are stable in flatness and parallelism. Heat sinks are generally stable in quality when they are produced by only etching. In the case of using both etching and pressing, however, etching may be performed from only one surface of a material, so that the depth of etching can be easily controlled and the cost can be therefore reduced.

Further, with this method, it is easy to form a silver-plated surface of a predetermined area in the position of a heat sink to which a semiconductor device is to be attached. This silver-plated surface gives a conspicuous effect to a wide variety of wire bonding systems in the vicinity of the chip to contribute to an improvement in performance of the device.

What is claimed is:

1. A method of producing a plurality of convex heat sinks for semiconductor devices, comprising:

providing a thermally conductive material;

etching said thermally conductive material to separate said thermally conductive material into said plurality of convex heat sinks wherein each convex heat sink comprises material having a projecting portion.

2. The method of producing said plurality of convex heat sinks for semiconductor devices of claim 1, wherein a dark color treatment layer is formed over each of said plurality of convex heat sinks.

3. A method of producing at least one convex heat sink for semiconductor devices, comprising:

providing a thermally conductive material having a first surface and a second surface;

forming a first resist film over said first surface of said thermally conductive material, wherein said first resist film is used for forming at least one projecting portion of said at least one convex heat sink;

forming a second resist film over said second surface of said thermally conductive material; and then etching said thermally conductive material using said first and second resist films as masks for producing separate ones of the at least one convex heat sink for the semiconductor devices.

4. The method of producing said at least one convex heat sink for semiconductor devices of claim 3, further comprising forming at least one silver-plated surface before forming said second resist film, said at least one silver-plated surface formed over said second surface of said thermally conductive material for mounting a semiconductor element.

5. The method of producing said at least one convex heat sink for semiconductor devices of claim 3, wherein said etching step is continued until said thermally conductive material separates into said at least one convex heat sink.

6. The method of producing said at least one convex heat sink for semiconductor devices of claim 3, wherein said second resist film forms one continuous layer over said second surface of said thermally conductive material, said method further comprising machining said etched thermally conductive material to obtain said at least one convex heat sink.

7. The method of producing said at least one convex heat sink for semiconductor devices of claim 3, wherein said thermally conductive material is oxygen free copper and said etching step is a wet-type etching using iron(II) chloride liquid.

8. The method of producing said at least one convex heat sink for semiconductor devices of claim 3, further comprising forming a solder layer over a first surface of said at least one convex heat sink.

9. The method of producing said at least one convex heat sink for semiconductor devices of claim 8, further comprising forming at least one silver-plated surface before forming said second resist film, said at least one silver-plated surface formed over said second surface of said thermally conductive material for mounting a semiconductor element.

10. The method of producing said at least one convex heat sink for semiconductor devices of claim 3, wherein the first resist film comprises a first plurality of resist film portions, each of said first plurality of resist film portions being separated from adjacent ones of said first plurality of resist film portions by first fixed spaces, and wherein said second resist film comprises a second plurality of resist film portions, each of said second plurality of resist film portions being separated from adjacent ones of said second plurality of resist film portions by second fixed spaces, each of said first plurality of resist film portions corresponding to one of said second plurality of resist portions.

11. The method of producing said at least one convex heat sink for semiconductor devices of claim 5, wherein the first resist film comprises a first plurality of resist film portions, each of said first plurality of resist film portions being separated from adjacent ones of said first plurality of resist film portions by first fixed spaces, and wherein the second resist film comprises a second plurality of resist film portions, each of said second plurality of resist film portions being separated from adjacent ones of said second plurality of resist film portions by second fixed spaces, each of said first plurality of resist film portions corresponding to one of said second plurality of resist film portions.

12. The method of producing said at least one convex heat sink for semiconductor devices of claim 3, wherein a dark color treatment layer is formed over each of said at least one convex heat sink.

13. The method of producing said at least one convex heat sink for semiconductor devices of claim 3, further comprising removing said first resist film and said second resist film after etching said thermally conductive material.

14. The method of producing said at least one convex heat sink for semiconductor devices of claim 3, further comprising:

removing said first resist film and said second resist film after etching said thermally conductive material; and forming a dark color treatment layer over each of said at least one convex heat sink.

15. The method of producing said at, least one convex heat sink for semiconductor devices of claim 4, further comprising:

removing said first resist film and said second resist film after etching said thermally conductive material; and forming a dark color treatment layer over each of said at least one convex heat sink, said dark color treatment layer not being formed over said at least one silver-plated surface.

16. A method for producing a semiconductor device which includes a convex heat sink, a semiconductor element being mounted on a surface of the convex heat sink, a plurality of leads being positioned apart from the semiconductor element and insulated from the convex heat sink, means for electrically connecting the plurality of leads to the semiconductor element, and resin seal for sealing the convex heat sink, the semiconductor element and the plurality of leads, wherein the convex heat sink is one of a plurality of convex heat sinks produced by a method comprising:

providing thermally conductive material having a first surface and a second surface;

forming a first resist film on the first surface for forming a projecting portion;

forming a second resist film on the second surface; and etching the thermally conductive material using the first and second resist films as masks for producing separate ones of the plurality of convex heat sinks.

* * * * *